United States Patent [19]
Safari et al.

[11] Patent Number: 5,615,466
[45] Date of Patent: Apr. 1, 1997

[54] MEHTOD FOR MAKING PIEZOELECTRIC COMPOSITES

[75] Inventors: Ahmad Safari, Princeton Junction; Victor F. Janas, Monroe Township; Thomas F. McNulty, Howell, all of N.J.

[73] Assignee: Rutgers University, Piscataway, N.J.

[21] Appl. No.: 390,094

[22] Filed: Feb. 17, 1995

Related U.S. Application Data

[63] Continuation-in-part of Ser. No. 263,564, Jun. 22, 1994, Pat. No. 5,539,965.

[51] Int. Cl.$^6$ .................................................. H01L 41/22
[52] U.S. Cl. ........................................... 29/25.35; 310/358
[58] Field of Search ................. 29/25.35; 310/334–336, 310/367, 800, 358, 357

[56] References Cited

U.S. PATENT DOCUMENTS

| | | |
|---|---|---|
| 3,590,287 | 6/1971 | Berlincourt et al. . |
| 4,412,148 | 10/1983 | Klicker et al. . |
| 4,518,889 | 5/1985 | 'T Hoen . |
| 4,523,471 | 6/1985 | Lee . |
| 4,564,980 | 1/1986 | Diepers . |
| 4,572,981 | 2/1986 | Zola . |
| 4,658,176 | 4/1987 | Nakoya et al. . |
| 5,175,709 | 12/1992 | Slayton et al. . |
| 5,239,736 | 8/1993 | Sliwa et al. . |
| 5,246,610 | 9/1993 | Banno et al. . |

OTHER PUBLICATIONS

Composite Piezoelectric Transducers; R. E. Newnham et al; Materials in Engineering, vol. 2, Dec. 1980, pp. 93–106.
Piezoelectric Ceramic–Polymer Composites for Transducer Applications; T.R. Gururaja et al, Electronic Ceramics, 1987, pp. 92–145.
PZT–Epoxy Piezoelectric Tranducers; H. P. Savakus et al; Materials Research Bulletin, vol. 16; 1981, pp. 677–680.
Smart Materials; Newnham et al; Ferroelectrics, vol. 102, pp. 259–266.
Fabrication of Continous Ceramic Fiber by the Viscous Suspension Spinning Process, Ceramic Bulletin, vol. 70, No. 3, 1991.

Primary Examiner—Carl E. Hall
Attorney, Agent, or Firm—John F. Ritter

[57] ABSTRACT

A disclosed process uses ceramic fiber fabrication technology and allows for novel composite designs, including composites with different polarizable material regions and composites with a gradient in volume fraction of polarizable material. Moreover, composites with fine-scale microstructures may be formed. The new forming method is an improvement to the traditional "dice and fill" technique currently being utilized to form piezoelectric composites.

14 Claims, 2 Drawing Sheets

METHOD FOR MAKING PIEZOELECTRIC COMPOSITES

This invention was made with Government support under the Office of Naval Research, Grant No. N00014-91-J-1828, and as such the Government has certain rights to this invention.

CROSS REFERENCE TO RELATED APPLICATIONS

This invention is a continuation-in-part of U.S. application Ser. No. 08/263,564 filed on Jun. 22, 1994 by Ahmad Safari and Victor F. Janas, now U.S. Pat. No. 5,539,965.

TECHNICAL FIELD

This invention relates to a method for fabricating piezoelectric composites and unique composites so fabricated. More particularly, it provides an improved and more efficient method for fabricating piezoelectric composite ultrasound transducers which are useful in medical imaging, hydrophone, non-destructive evaluation, actuator, and smart material applications.

BACKGROUND OF THE INVENTION

Transducers, such as those employed in the medical ultrasound imaging industry, typically employ piezoelectric ceramic materials such as lead-zirconate-titanate (PZT) to both emit and receive ultrasound waves. In recent years, however, composites have become the focus of piezoelectric research and development. Composite piezoelectric materials, typically combinations of polymers and ceramics, can increase the desired properties of the transducer while virtually eliminating the inherent weaknesses of the individual materials. A ceramic-polymer piezoelectric composite for example, retains a high piezoelectric coefficient and moderate dielectric loss which is characteristic of a typical piezoelectric ceramic, while decreasing the overall density and brittleness of the transducer. Moreover, polymers allow for flexibility and shape variability in the final composite. As a result, the properties of such composites are far superior to those of bulk ceramics or piezoelectric polymers alone.

Composite piezoelectric transducers, and methods for their production, are described, for example, in *Composite Piezoelectric Transducers;* R. E. Newnham et al; *Materials in Engineering,* Vol. 2, December 1980, 93–106, which is incorporated herein by reference.

Piezoelectric composites typically consist of a polarizable phase embedded in a non-polarizable material. These composites have many advantages over traditional monolithic piezoelectric ceramics including: (i) lower densities resulting in acoustic impedances closer to those of the human body, water, etc., eliminating the need for an acoustic matching layer, (ii) low dielectric constants, resulting in high piezoelectric voltage constant g, and (iii) ease of conformability to the shape of the backing material of the composite.

Two composite designs that have been particularly successful are composites with 2—2 and 1–3 connectivity. In these designs, the piezoelectric or polarizable phase is aligned in the poling direction of the composite (in a matrix of a suitable polymer.) In the case of the 2—2 composite, both the ceramic and polymer phases are two-dimensionally connected throughout the composite. The stiff ceramic phase supports most of the stress applied in the direction of its alignment, yielding a high piezoelectric charge coefficient $d_{33}$, while the composite maintains a low density and dielectric constant.

In the 1–3 composite, the ceramic phase is one-dimensionally connected through the composite, while the polymer phase is three-dimensionally connected. For certain applications, the 1–3 composite yields superior properties to those described above for the 2—2 composite due to the lower density and lower dielectric constant. Connectivity, including types 1–3 and 2—2, are described in detail in *Composite Piezoelectric Transducers;* R. E. Newnham et al; *Materials in Engineering,* Vol. 2, December 1980, pages 93–106, which is incorporated herein by reference.

A common and convenient method for making 2—2 and 1–3 composites is to start by cutting parallel slots into a monolithic piezoelectric ceramic block. The slots are then filled with a polymer. Typically, this polymer filler is non-polarizable. If one set of parallel slots are cut, the resulting composite has a 2—2 connectivity. If a second set of parallel slots are cut orthogonally to the first set of slots and backfilled with a filler material, the resulting composite has a 1–3 connectivity. Transducer fabrication continues by grinding the unslotted section of the monolithic ceramic away from the slotted section, lapping the two sides parallel to one another, and electroding the surfaces containing exposed ceramic. The resulting structure essentially comprises a semiflexible mat consisting of strips, posts or rods of piezoelectric material laterally encased by polymeric matrix material such as epoxy.

A strong electric field is then applied to the composite in a direction perpendicular to the plane of the polarizable sheet using conventional poling or corona discharge techniques. The intensity of the electric field used will ordinarily be selected to provide efficient polarization. However, it will be kept below the range at which substantial dielectric breakdown of the material being polarized occurs. The aforementioned method is known as the "dice and fill" method and is described in *PZT-Epoxy Piezoelectric Transducers: A Simplified Fabrication Procedures,* H. P. Savakus et al; *Materials Research Bulletin,* Vol. 16, 1981, pages 677–680, which is incorporated herein by reference.

Although, as mentioned above, piezoelectric composites typically consist of a polarizable phase embedded in an non-polarizable phase, there is a need to develop efficient manufacturing method for production of composites having multiple polarizable and/or non-polarizable phases. Also, there is a need to develop more efficient methods for the manufacture of piezoelectric composites having decreased size and/or periodicity of the polarizable phase or phases. Composites having these properties have been identified as a key area of transducer development.

Some examples of these needs are evidenced in the field of medical imaging. The resolution of imaging systems can be enhanced by increasing the frequency of the generated sound wave from the transducer. To increase the frequency of the sound wave, the size and periodicity of the polarizable phase in the composite must be decreased. In addition, enhanced pulse-echo properties are realized if the transducer contains transmitting and receiving sections wherein the transmitting sections contain an polarizable phase with high transmitting sensitivity, while the receiving sections contain a polarizable phase with high receiving sensitivity.

Moreover, there has been a drive to create so-called "smart" materials. Smart materials are described in *"Smart Ceramics"*; Newnham et al., Ferroelectrics, Vol. 102, pp. 259–266 which is incorporated herein by reference. A smart material senses a change in the environment, and using a feedback system, makes a useful response. It may be both a sensor and an actuator. A very smart material can tune its sensor and actuator functions in time and space to optimize behavior. Tuning of a very smart material can be accomplished by using a multitude of polarizable phases.

Finally, it would be desirable to have an efficient method to tailor the piezoelectric properties within a single transducer by varying the ceramic volume content across the device. This reduces the out of plane distortions of the transmitted signal.

The "dice and fill" method has several limitations in meeting the above stated needs. Dicing technology utilizes thin, diamond coated blades rotating at high speeds. The blades, often thinner than 200 microns, are expensive, difficult to handle, and have short usage lives. Moreover, the "dice and fill" technique uses monolithic ceramics, ruling out the possibility of composites with multiple polarizable ceramic phases. Finally, varying the ceramic volume content across the transducer would require frequent changes of dicing blades to vary the thickness of the slots, substantially adding to the time it takes to produce a transducer.

SUMMARY OF THE INVENTION

The object of this invention is to provide a better method for fabricating fine size and periodicity piezoelectric composites for use in transducer applications.

Another object of this invention is to provide novel piezoelectric polymer composites with improved properties.

Another object is to provide an improved methodology for forming acoustic devices with a multitude of functions. The transducer may, therefore, be multifunctional, and designed with regions of transmission, reception, sensing, actuation, etc. The method allows for a virtually unlimited number of polarizable or unpolarizable phases.

Yet another object is to provide an improved methodology for forming composites with a varying ceramic volume content across the structure.

This invention utilizes a relatively recent advance in piezoelectric manufacturing technology—continuous piezoelectric fibers. The fabrication of such fibers is described, for example in *Fabrication of Continuous Ceramic Fiber By Viscous Suspension Spinning Process,* Richard B. Cass; *Ceramic Bulletin,* Vol. 70, No. 3, 1991, pages 424–429 which is incorporated herein by reference.

In this process, called "VSSP" the fiber is made by mixing the ceramic powder with a rayon fiber precursor in a sodium hydroxide solution, then extruding the solution into a sulfuric acid bath. The resultant fiber is continuous and is comprised of a ceramic powder with cellulose binder. The fiber is subsequently heated to burn off the organic matter and to sinter the ceramic phase or phases.

Fibers with sintered diameters as small as 15 microns have been formed using this process. Additionally these fibers have been shown to have moderate strength which allows the formation of various woven complex structures and bundles of individual fibers. As used in this specification, the term "fiber" may be either one individual filament or a bundle of individual filaments like yarn or rope. The VSSP process can be used to make various fiber compositions including lead magnesium niobate (PMN—PT), barium titanate (BT), and lead titanate (PT) among others.

Composites formed using the method of this invention utilize a ceramic fiber, such as one made using the method described above. Sized fibers, green or sintered, are inserted through reticulated structures which are spaced apart by spacers to hold them in place at the desired spacing. The reticulated structure is typically a ceramic material such as lead zirconate titanate $Pb(ZrTi)O_3$, barium titanate $BaTiO_3$, or zirconia ($ZrO_2$) and may be green or fired. The reticulated structures are also called "honeycomb" structures by those skilled in the art and for example may be Celcor® which is manufactured by Corning, Inc. Other compositions, including polymers, may be utilized so long as the composition is compatible with the active phase fiber. The reticulated structures can be formed utilizing a variety of different methods including, but not limited to, extrusion and injection molding.

If necessary, the entire assembly is placed in a furnace to burn off any organic binder or sizing and to subsequently sinter the fibers. The entire assembly is then embedded in a polymer and the polymer is cured. Finally the spacers and reticulated structures are removed to yield a composite adaptable for use as a piezoelectric composite.

This innovative processing method forms a composite with 1–3 connectivity without the cutting of the traditional "dice and fill" method. It allows the formation of composites with fine ceramic scale and volume fraction gradients. Moreover, the present invention allows for the efficient manufacture of multiphasic composites.

A desired process of this invention for making a composite adapted for use in providing a piezoelectric composite, comprises the following steps:

a) providing a plurality of reticulated structures, wherein spacers are used to provide said reticulated structures in a spaced relationship;

b) inserting one or more fibers through said reticulated structures, said fiber or fibers containing one or more polarizable phases;

c) heating, if applicable, said reticulated structures having said inserted fiber or fibers to a temperature sufficient to remove any unwanted organic material or sinter said fiber or fibers or both;

d) filling the spaces between said reticulated structures with a filler material, said filler material having an acoustic impedance which is substantially different from the acoustic impedance of the material of said fibers to form a composite;

e) removing said spacers provided that said spacers would substantially interfere with the functioning of said composite; and f) removing said reticulated structures provided said reticulated structures have a composition with a substantially different impedance from the impedance of said filler material and provided that said reticulated structures would substantially interfere with the functioning of said composite.

The invention disclosed herein allows any or all of the above mentioned composite designs, resulting in a high degree of flexibility in transducer design. The composite can be fine scale, multifunctional, or both, with tailored properties within a single transducer.

BRIEF DESCRIPTION OF THE DRAWINGS

Comprehension of the invention is facilitated by reading the following detailed description in conjunction with the annexed drawings, in which:

FIGS. 1 to 5 illustrate the sequence of steps which are used in manufacturing a composite, while

FIG. 1 is a perspective drawing of the reticulated structures, separated by spacers;

FIG. 2 is a perspective drawing of the reticulated structures, separated by spacers, with polarizable fibers being sewn through them;

FIG. 3 is a perspective drawing of the reticulated structures, separated by spacers, after the polarizable fibers have been fully sewn through;

FIG. 4 is a perspective drawing of the entire assembly after firing, and after filler material embedding;

FIG. 5 is a perspective drawing of the composite after the reticulated structures and spacers have been removed; and FIG. 6 is a perspective drawing showing a further embodiment according to the present invention in which a transducer contains multiple polarizable phases.

DETAILED DESCRIPTION OF THE INVENTION

FIGS. 1 through 5 show the steps for manufacturing a piezoelectric composite constructed in accordance with the principles of the present invention.

Figure 1:
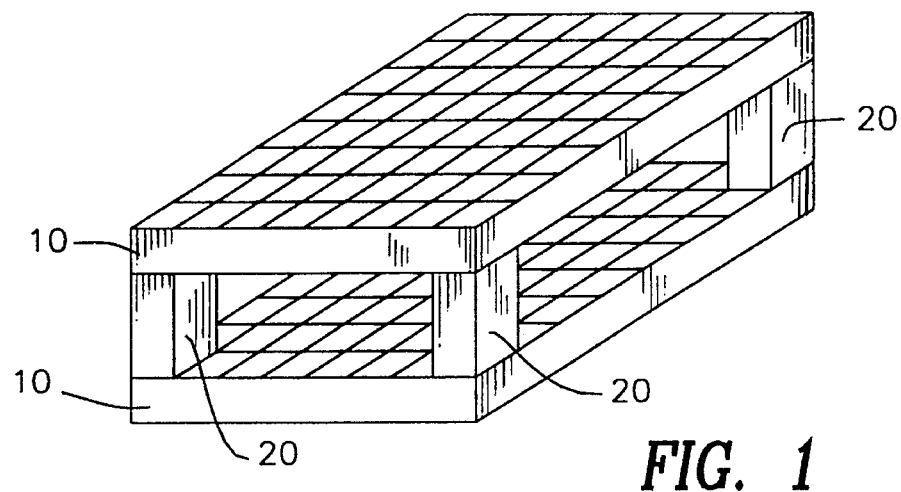

FIG. 1 is a fiber support assembly which is formed by separating two reticulated structures 10 with spacers 20. The reticulated structures may consist, for instance, of lead zirconate titanate $Pb(ZrTi)O_3$, or barium titanate $BaTiO_3$, or of another material compatible with the fiber. They may be formed by conventional extrusion or injection molding methods, or other ceramic forming processes. The spacers 20, consisting of material of thickness depending on the desired spacing between the reticulated structures 10, are arranged between the reticulated structures 10. The reticulated structures 10 and spacers 20 may be secured by ceramic cement (not shown). If the reticulated structures 10 are unfired or "green" no cement is needed to secure the spacers 20.

Figure 2:
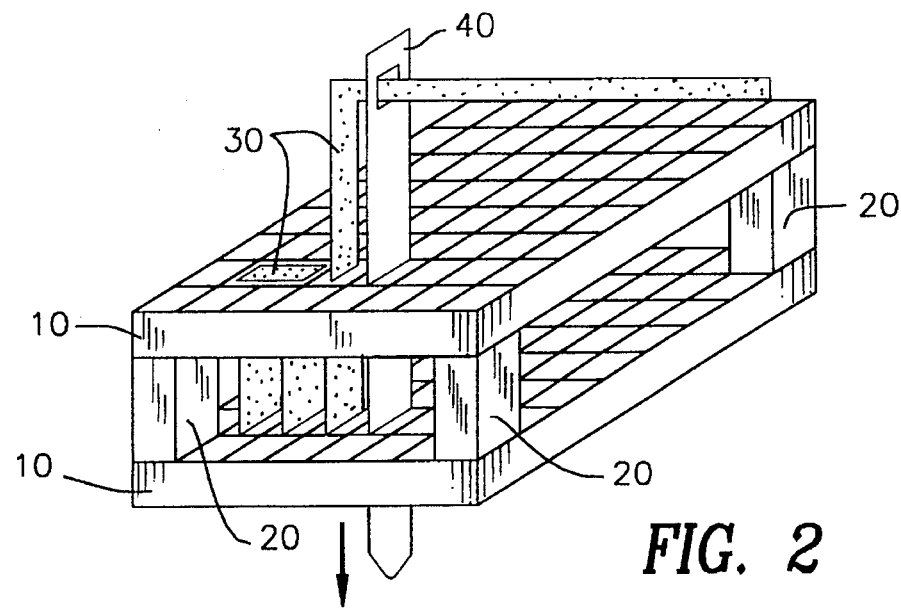

After the entire support assembly has been built, polarizable fibers are woven, or sewn through it. FIG. 2 shows polarizable material fibers 30 being sewn through the entire assembly with a needle 40. The fibers usually consist of lead zirconate titanate $Pb(Zr,Ti)O_3$, lead metaniobate $Pb(Nb_2O_6)$, modified lead titanate $PbTi_3$, including $(Pb,Ca)TiO_3$ and $(Pb,Sm)TiO_3$, barium titanate $BaTiO_3$, PMN—PT $(1-x)Pb(Mg_{1/3}Nb_{2/3})O_3$—$xPbTiO_3$, PZN—PT/BT $Pb(Zn_{1/3}Nb_{2/3})O_3$—$xPbTiO_3$—$BaTiO_3$, or of another suitable transmitting, receiving, or sensing material. The fibers may be fully sintered, or may be unfired, or green. To aid in weaving or sewing, the fibers may be coated with a standard sizing agent, for instance polyvinyl alcohol, or cellulose. The pattern of the weaving or sewing determines the microstructure of the final composite.

Figure 3:
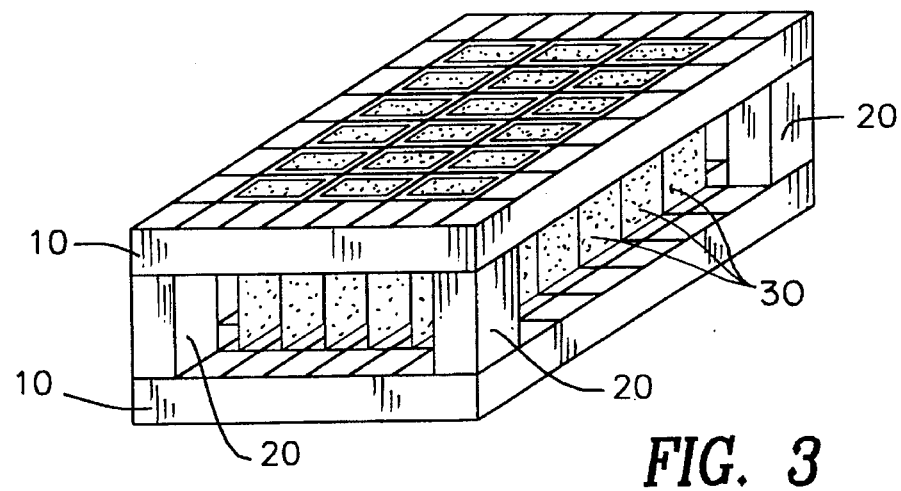

After sewing or weaving of fibers through the reticulated structures, the support assembly is ready for processing. FIG. 3 illustrates the results of sewing the polarizable fibers 30 through the reticulated structures 10. If unfired, or green, polarizable fibers have been used, the entire assembly may be heat treated to densify the fibers. FIG. 3 illustrates the structure upon completion of the heat treatment.

Figure 4:
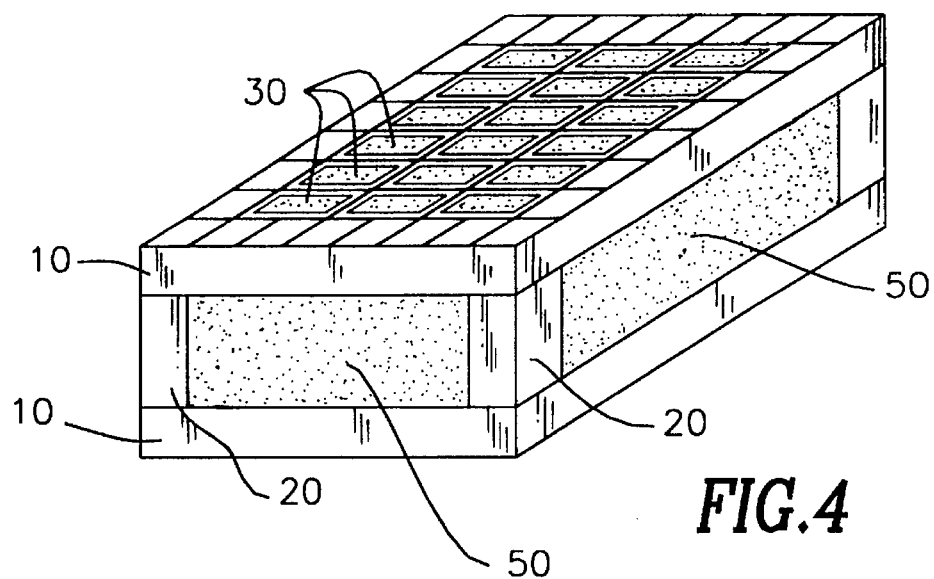

After heat treating has been completed, the entire assembly is filled with a polarizable or non-polorizable filler material by pouring, injection, or by immersion of the assembly. The filler material may consist of a self-hardening plastic, for example epoxy or silicone rubber or a polarizable material such as poly(vinylidene fluoride) and copolymers thereof, polyvyinylchloride, polyvyinylfluoride, or other polymer having suitable piezoelectric properties. Moreover, the filler may also be glass or ceramic. FIG. 4 shows the entire support assembly consisting of reticulated structures 10 and spacers 20 with polarizable fibers 30 sewn through it embedded with filler material 50.

Figure 5:
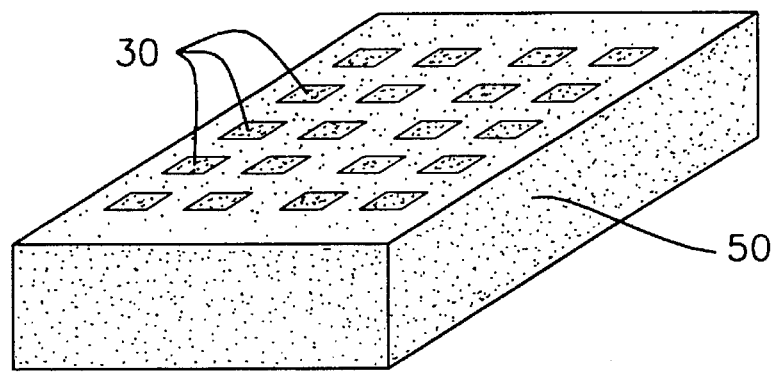

After being embedded in filler material, the reticulated structures 10 and spacers 20 may be trimmed or lapped away. FIG. 5 shows an example of one possible final piezoelectric composite or transducer, consisting of polarizable material pillars 30 fully embedded with filler material 50. Although not illustrated, the composite would then be electroded with, for example, a silver paint on its end faces, and poled under an electric field.

Figure 6:
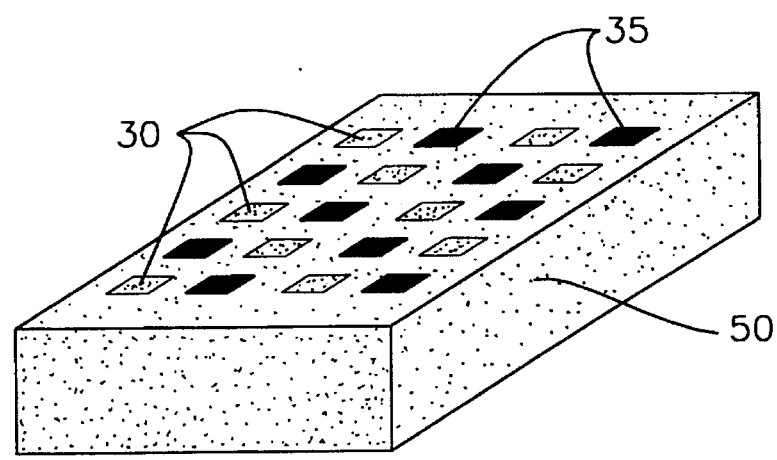
FIG. 6 is a further embodiment of according to present invention.

As a further embodiment of the present invention, a composite may contain multiple polarizable phases. FIG. 6 is a perspective drawing showing such an embodiment. The figure shows active phases 30 and 35 embedded in non-polarizable filler material 50. The polarizable phases may be materials which act as transmitters, receivers, sensors, or actuators in the resulting transducer. The different active phases are introduced into the composite during the manufacturing step illustrated in FIG. 2, where the polarizable fibers 30 are varied in constructing the piezoelectric composite. Though the illustrated embodiment shows only two polarizable phases, the described invention method allows for an unlimited number of polarizable phases arranged on as fine a scale as fiber by fiber.

Although not illustrated, a further embodiment of the present invention is a composite material which both the number of polarizable materials and the polarizable phase volume content across the composite is varied. Further, the arrangement of polarizable phases may be accomplished on as fine a scale (<50 microns) as state of the art techniques allow.

Further embodiments, also not illustrated, include composites in which the fibers would consist of a non-polarizable phase(s) such as epoxy resin or a polarizable phase(s) such as a polymer that is susceptible to polarization such as poly(vinylidene flouride) and its copolymers. The filler material may also either consist of a polarizable or non-polarizable composition allowing for a composite with both the fibers and the filler or fillers made from an polarizable materials.

The following examples will further illustrate the present invention.

EXAMPLE 1

Ceramic fiber/polymer composites with 1–3 connectivity were formed by weaving green PZT fiber through a ceramic reticulated structure. Reticulated structures were constructed from two barium titanate honeycomb disks. The barium titanate disks were cut from an extruded reticulated or honeycomb bar which had been previously sintered. Disk thickness ranged from 3 to 4 mm., which allowed for fiber shrinkage without allowing the fiber to leave the reticulated structure cavity entirely. Spacing between the disks varied between 3 and 5 mm. Green fiber was then woven through the support assembly to create the desired 1–3 connectivity. Bundle count in the fiber varied from 2 to 4 bundles, depending on the desired volume fraction.

After the fiber was woven through the support structure, a binder burnout schedule was followed. A ramp of 3.5° C./min. up to 750° C., followed by a two hour soak at 750° C. proved adequate for burning out the cellulose binder. Sintering was performed using a schedule of 3.5° C./min. up to 1250 ° C., with a soak period of two hours at 1250° C. Sintering was performed in a closed crucible with excess lead source.

After sintering, the structures were then embedded in epoxy. Several epoxys were tried, including Spurrs epoxy (E. F. Fullam, Inc. Schenectady, NY), Eccogel epoxy resin 1365-45 (Emerson and Cumming, Deway and Almay Chemical Division, Canton, MA), and Eccogel epoxy resin 1365-80. After the epoxy cured, the reticulated structures and the spacers were cut off, and the samples were polished to about a 2 mm. thickness. Samples were then electroded, and poled using the Corona poling method. After poling, composites were aged for 24 hours before measuring electromechanical properties. Capacitance and dielectric loss factors were measured at 1 kHz using a Hewlett-Packard model 4194A impedance/gain analyzer. The $d_{33}$ values were measured at 100 Hz using a Channel Products model CPDT-3300 piezo $d_{33}$ meter. The $d_h$ of the composite was determined dynamically by comparing the measured hydrostatic response to that of a standard.

Properties of composites are compared to those of standard lead zirconate titanate (PZT) on the Table I where $V_{PZT}$=Volume fraction of PZT (%); K=relative permittivity; $d_{33}$=longitudinal piezoelectric charge coefficient (picocoulomb/Newton); $g_h$=hydrostatic voltage coefficient (millivolt*meter/Newton); $g_h$=hydrostatic voltage coefficient (millivolt*meter/Newton; $d_h$=hydrostatic charge coefficient (picocoulomb/Newton); $d_h g_h$=hydrostatic figure of merit ($10^{-15}$m$^2$/Newton).

TABLE I

| MATERIAL | $V_{PZT}$ | K | $d_{33}$ | $g_h$ | $d_h$ | $d_h g_h$ |
|---|---|---|---|---|---|---|
| PZT | 100 | 1800 | 400 | 5 | 20 | 100 |
| 1-3 Composite | 6 | 65 | 60 | 35 | 20 | 700 |

EXAMPLE 2

Ceramic fiber/polymer composites with 1-3 connectivity were formed by weaving green PZT fiber through a green PZT ceramic reticulated structure. The reticulated structures were constructed from two green PZT reticulated or honeycomb disks. Reticulated structures made from PZT were chosen because a reaction between the PZT fiber and the reticulated structure would therefore be unlikely.

Since the green PZT reticulated structure is inert with respect to PZT fibers, the increased size of green reticulated structure allowed for an increased volume of sized fibers to be used in the production of the fiber composites. The reticulated structures were 4 to 5 mm thick. The spacers were cut to thickness of about 6 mm. Since the green PZT reticulated structure was extruded using a water soluble binder, calcium carbonate cement was unnecessary. Instead, the introduction of water at the contact points of the support assembly softens the reticulated structure, which becomes one cohesive unit after drying. Green fiber was then woven through the support structure to create the desired 1-3 connectivity. Bundle count within the fiber varied from 2 to 4 bundles, depending on the desired volume fraction.

After the fiber was woven through the support assembly, a binder burnout schedule was followed. Binder burnout was performed using a ramp of 1.5° C./min. to 550° C., followed by a soak time of 2 hours.

Sintering was performed using a schedule of 3.5° C./min. up to 1250° C., with a soak period of two hours at 1250° C. Sintering was performed in a closed crucible with excess lead source.

After sintering, the structures were then embedded in epoxy. Several epoxys were tried, including Spurrs epoxy (E. F. Fullam, Inc. Schenectady, NY), Eccogel epoxy resin 1365-45 (Emerson and Cumming, Deway and Almay Chemical Division, Canton, MA), and Eccogel epoxy resin 1365-80. After the epoxy cured, the reticulated structures and spacers were cut off, and the samples were polished to about a 2 mm. thickness. Samples were then electroded, and poled using the Corona poling method. After poling, composites were aged for 24 hours before measuring electromechanical properties. Capacitance and dielectric loss factors were measured at 1 Hz using a Hewlett-Packard model 4194A impedance/gain analyzer. The $d_{33}$ values were measured at 100 Hz using a Channel Products model CPDT-3300 piezo $d_{33}$ meter. The $d_h$ of the composite was determined dynamically by comparing the measured hydrostatic response to that of a standard.

TABLE II

| MATERIAL | $V_{PZT}$ | K | $d_{33}$ | $g_h$ | $d_h$ | $d_h g_h$ |
|---|---|---|---|---|---|---|
| PZT | 100 | 1800 | 400 | 5 | 20 | 100 |
| 1-3 Composite | 10 | 110 | 230 | 15 | 30 | 900 |

The invention described herein has been disclosed in terms of specific embodiments and applications. However, these details are not meant to be limiting and other embodiments, in light of this teaching, would be obvious to persons skilled in the art. Accordingly, it is to be understood that the drawings and descriptions are illustrative of the principles of the invention, and should not be construed to limit the scope thereof.

What is claimed is:

1. A process for making a piezoelectric composite, comprising the following steps:
   a) providing a plurality of reticulated structures, using spacers to provide said reticulated structures in a spaced relationship;
   b) weaving one or more green ceramic fibers through said reticulated structures, said green ceramic fiber or fibers containing one or more piezoelectric phases;
   c) heating said reticulated structures having the woven green ceramic fiber or fibers to a temperature sufficient to remove any unwanted organic material and sinter said green ceramic fiber or fibers; and
   d) filling the space between said reticulated structures with a filler material, said filler material having an acoustic impedance which is substantially different from the acoustic impedance of the material of the sintered fibers to encapsulate the sintered fibers and form a composite therewith.

2. The process of claim 1 wherein the polarizable phase or phases of the fibers are selected from the group consisting of $Pb(Zr,Ti)O_3$, $Pb(NbO_3)_2$, $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3$—$xPbTiO_3$, $Pb(Zn_{1/3}Nb_{2/2})O_3$—$PbTiO_3/BaTiO_3$, and $Pb(Zn_{1/3}Nb_{2/3})O_3$—$BaTiO_3$—$PbTiO_3$.

3. The process of claim 1 wherein the fiber or fibers have varied ceramic loadings.

4. The process of claim 1 wherein the fiber or fibers are comprised of two or more different compositions.

5. The process of claim 1 wherein the fibers are equispaced apart from one another.

6. The process of claim 1 wherein the fibers are not equispaced from one another.

7. The process of claim 1 wherein the spacers have a composition with an impedance which is substantially different from the impedance of the filler material and would substantially interfere with the functioning of the composite.

8. The process of claim 1 wherein the spacers have a composition with an impedance which is not substantially different from the impedance of the filler material and would not substantially interfere with the functioning of the composite.

9. The process of claim 1 wherein the fibers are less than 10 microns in diameter.

10. The process of claim 1 wherein the fibers are ceramic and are less than 10 microns in diameter after sintering.

11. The process of claim 1 wherein after step d, said spacers are removed.

12. The process of claim I wherein said reticulated structures are removed.

13. The process of claim 11 wherein after the removal of said spacers, said reticulated structures are removed.

14. The process of claim 11 wherein the piezoelectric phase or phases of the fibers are selected from the group consisting of $Pb(Zr,Ti)O_3$, $Pb(NbO_3)_2$, $BaTiO_3$, $PbZrO_3$, $PbTiO_3$, $PbNb_2O_6$, $(Pb,Sm)TiO_3$, $Pb(NbO_2)_2/PbTiO_3$, $(1-x)Pb(Mg_{1/3}Nb_{2/3})O_3$—$xPbTiO_3$, $Pb(Zn_{1/3}Nb_{2/3})O_3$—$PbTiO_3/BaTiO_3$, and $Pb(Zn_{1/3}Nb_{2/3})O_3$—$BaTiO_3$—$PbTiO_3$.

* * * * *